United States Patent
Frijlink

(12) 
(10) Patent No.: US 6,475,286 B1
(45) Date of Patent: Nov. 5, 2002

(54) SEAL MEANS FOR SEPARABLE CLOSING ELEMENTS, SUCH AS SEPARABLE ELEMENTS OF CHEMICAL VAPOR DEPOSITION CHAMBER AND DEPOSITION REACTOR APPARATUS

(75) Inventor: Peter Frijlink, Yerres (FR)

(73) Assignee: Aixtron Aktiengesellschaft, Aachen (DE)

( * ) Notice: Subject to any disclaimer, the term of this patent is extended or adjusted under 35 U.S.C. 154(b) by 143 days.

(21) Appl. No.: 09/614,808

(22) Filed: Jul. 12, 2000

(30) Foreign Application Priority Data

Jul. 13, 1999 (EP) .............................. 99401760

(51) Int. Cl.$^7$ ............................... C23C 16/00
(52) U.S. Cl. ................. 118/719; 118/715; 118/733
(58) Field of Search ................. 118/715, 733, 118/719

(56) References Cited

U.S. PATENT DOCUMENTS

| | | | | |
|---|---|---|---|---|
| 4,450,786 A | * | 5/1984 | Doehler | 118/719 |
| 4,961,399 A | | 10/1990 | Frijlink | 118/730 |
| 4,976,217 A | | 12/1990 | Frijlink | 118/733 |
| 5,105,762 A | | 4/1992 | Wilkinson | 118/733 |
| 5,370,739 A | * | 12/1994 | Foster | 118/733 |

FOREIGN PATENT DOCUMENTS

JP 3-249936 * 11/1991

* cited by examiner

Primary Examiner—Richard Bueker
(74) Attorney, Agent, or Firm—Schiff Hardin & Waite

(57) ABSTRACT

The invention relates to seal means (I, TR) for sealing two substantially flat closing surfaces ($9a,7a$), respectively of two separable elements (9,7), for forming a boundary between a first space (101) and a second space (102), in order to prevent a first gas flow ($\Phi 1$) propagating in the first space to exit through an interface (I) between said two closing surfaces disposed one opposite to the other for sealing, comprising the construction of a set of troughs (TR) in at least one of the closing surfaces (9), carried out throughout the length (L) of said boundary in the direction of said first flow, and comprising a counter-flow ($\Phi 2$), propagating from the second space (102) through said troughs, which have construction parameters including a width (w), a depth (h) and a separating width (W), determined in combination with the height (H) of the interface (I) and said length (L) of the boundary, for preventing the first flow ($\Phi 1$) to exit through the interface (I) along the troughs (TR) and along the length (L) and width (W) of the interface (I) between the troughs (TR). The invention also relates to a chemical vapor deposition chamber for processing semiconductor wafers and to a reactor having such seal means.

13 Claims, 3 Drawing Sheets

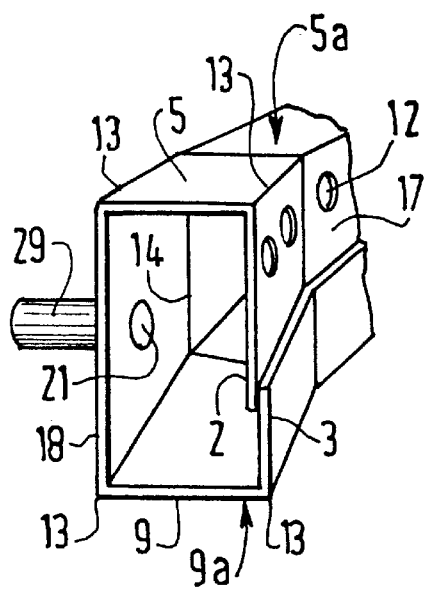
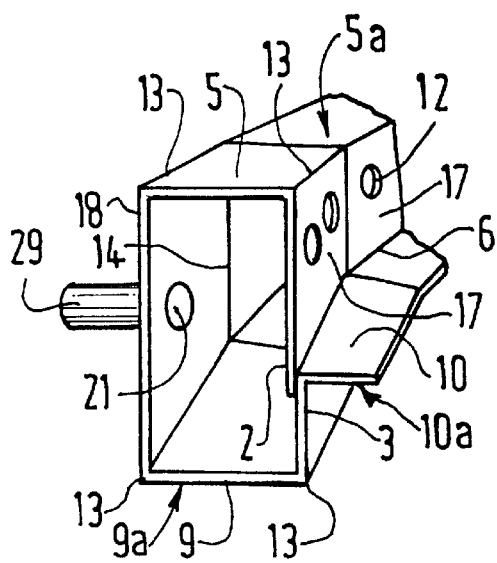
FIG.3A  FIG.3B
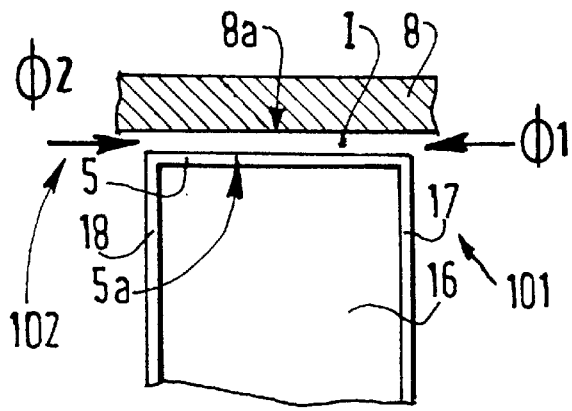
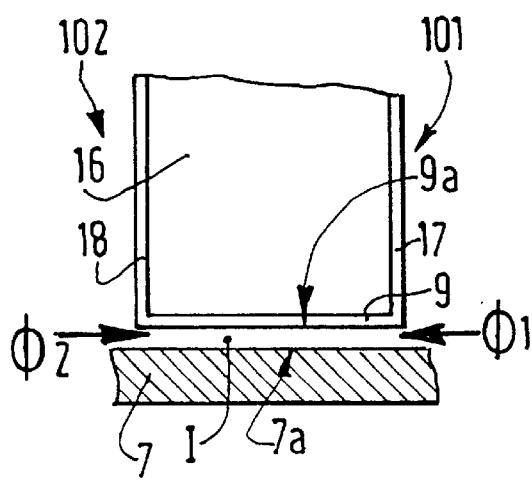
FIG.4A  FIG.4B
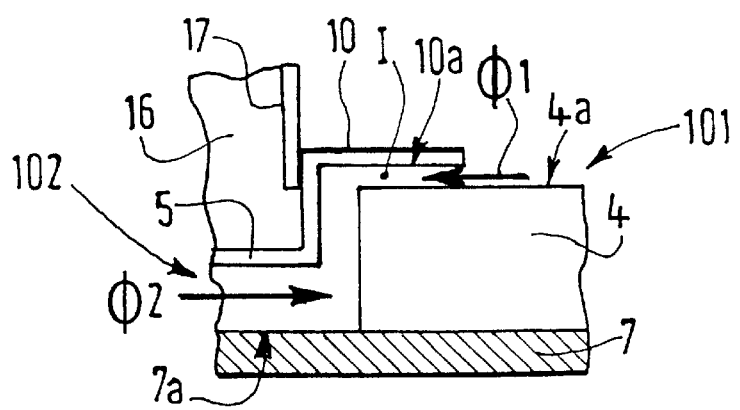
FIG.4C

SEAL MEANS FOR SEPARABLE CLOSING ELEMENTS, SUCH AS SEPARABLE ELEMENTS OF CHEMICAL VAPOR DEPOSITION CHAMBER AND DEPOSITION REACTOR APPARATUS

FIELD OF THE INVENTION

The invention relates to seal means for sealing two substantially flat closing surfaces, respectively of two separable elements, said elements forming, when sealed, a boundary between a first space and a second space, in order to prevent a first gas at a first pressure, which is flowing in the first space, to exit through an interface that is still present between said two closing surfaces disposed one opposite to the other for sealing.

The invention further relates to such seal means for high temperature chemical vapor deposition chamber. The invention also relates to a chemical vapor deposition apparatus having a deposition chamber with such seal means.

The invention finds an application in the industry of vapor deposition apparatus for manufacturing semiconductor devices, for example, gallium arsenide semiconductor devices.

BACKGROUND OF THE INVENTION

A support and seal structure for CCVD reactor is already known from U.S. Pat. No. 5,105,762. This document discloses a multi-chamber continuous chemical vapor deposition reactor. In the process chambers, the deposition process depends upon gas flow through the reactor. A semiconductor wafer is placed in a carrier and is moved successively through the various chambers and out the end of the reactor. The various chambers are separated by junction walls. Each process chamber has associated heat means for the wafer, gas inlets and outlets, a track on which the wafer carrier is moved and seal means to prevent the gas from escaping towards the environment outside the reactor, and to prevent exhaust gases from entering the process chambers. The seal means may be a pressure differential seal to prevent a gas from entering an area within the reactor or escaping the reactor at points other than the exhaust ports. Such a gas seal means may be formed between a process chamber wall and a junction wall. A process chamber wall is held against the junction wall by a clamp assembly made up of flange parts and bolts. The interface between the clamp and the process chamber wall is not a hermetic seal. An inert purge gas such as nitrogen $N_2$ is introduced through a gas plenum formed through the junction wall towards the interface opening. The nitrogen $N_2$ propagates into the interface opening in two directions. On the one hand, the nitrogen $N_2$ flows out through a first part of the interface opening disposed between the flange and the process chamber wall in the direction of the outside of the reactor. On the other hand, the nitrogen $N_2$ flows out in an opposite direction, through a second part of the interface opening disposed between the process chamber wall and the junction wall to an exhaust port towards an exhaust plenum located on the other side of the junction wall with respect to the process chamber wall. Reactive process gases such as Silane, $H_2$, HCl are introduced into an inlet formed through the junction wall and flow into the reactor chamber over a susceptor for a wafer and out said exhaust port into said exhaust plenum. The pressure of the inert gas $N_2$ introduced into the junction wall/chamber wall interface opening is greater than that of the reactive process gases introduced into the specific inlet so that the reactive process gases must flow into the reactor chamber, thus sealing the environment outside the reactor chamber from the reactive process gases. In particular, a part of the reactive process gases, which may tend to flow out through the first part of the interface opening towards the outside of the process chamber, is forced through an outlet, which is formed inside the junction wall and towards said exhaust plenum, by the counter-flow constituted by the inert gas $N_2$.

So, in the known patent, the chamber wall is fixed to the junction wall using flanges and bolts thus defining a fixed interface in a high temperature area. The chamber and the junction walls are not movable the one with respect to the other in the strict meaning of the term. They are only apt to be dismantled. The high temperature seal means are not intended to be installed between movable elements. The inert gas, which is introduced in the same area of the junction wall as the reactive gases, prevents the flowing reactive gases from exiting through the so-called fixed interface by forming a counter-flow. The reactor apparatus comprises several small chambers that each receives only one wafer at a time. It is the wafer that is movable.

Problems occur when the process chamber is of great dimension in order to accommodate several wafers at the same time, and when a first element of said large process chamber must be movable with respect to a second element, for example, for opening/closing the process chamber for introducing the wafers. An other problem occurs when said movable elements are located in a high temperature area where the process reactive gases are flowed through the process chamber at high temperature.

Due to the location in a high temperature area, it is not possible to make use of standards seals to seal such first and second movable elements. Now, due to the great dimension of the process chamber, and in view of opening/closing the process chamber, a first closing surface formed as a flat portion of the first movable element is not allowed to be simply set in contact upon a corresponding second closing surface formed as a flat portion of the second movable element, because a sufficient degree of flatness of these large-dimensioned closing surfaces is not possibly mechanically obtained. The unavoidable closing interface would be irregular. So, such a way of closing the process chamber by simple contact of opposite closing surfaces, without sealing means, would let the flowing reactive gases exit through the unavoidable closing interface, or a counter-flow formed by an inert gas flowing through said closing interface would have an irregular flow and could not be regularly efficient. Usually, in chemical deposition process, the flowing process reactive gases that are used are very dangerous and polluting and may not be allowed to flow outside the process chamber but through the plenum exhaust.

An other problem, in chemical vapor deposition, is that the gas pressure inside the process chamber is not allowed to be substantially different from the atmospheric pressure value. So, the inert gas for forming a counter-flow may be introduced in a way that does not disturb the process pressure value, i. e. the amount of inert gas for forming an effective counter-flow may not be too important whichever the peripheral length of the movable elements of the process chamber. Too great an amount of inert gas to prevent the flowing reactive process gases from exiting the reactor chamber, may mix with, and dilute said gases, and may disturb the process performed inside the process chamber.

Also a problem, due to the fact that the inert gas is not allowed to disturb the process, is that the inert gas may not be introduce in the same area as the process gases because the odds that the inert gas and the process gases mix are too important.

So the problems of providing seal means for movable elements of a process chamber in a reactor, taking into account that the process chamber has great dimension and that the movable elements are located in high temperature area, typically more than 300° C. (three hundred degree centigrade), the process being carried out using flowing reactive gas at low pressure value (substantially near the atmospheric pressure), is not solved by the disclosure of the known document.

SUMMARY OF THE INVENTION

It is a purpose of the invention to provide seal means for movably sealing two substantially flat closing surfaces, respectively of two movable elements, said elements forming, when sealed, a boundary between a first space and a second space, in order to prevent a first gas at a first pressure, which is flowing in the first space, to exit through an interface that is still present between said two closing surfaces disposed one opposite to the other for sealing.

It is a further purpose of the invention to provide a process chamber having seal means, to be applied to first and second closing surfaces of movable first and second elements of said process chamber, said elements forming, when sealed, a boundary between the process chamber, referred to as first space, and a second space surrounding said process chamber, to permit of moving said first and second elements the one with respect to the other to open or close the process chamber between process operations, said process operations taking place in the process chamber using flowing process gases at a predetermined gas pressure, while preventing said flowing process gases to exit the process chamber but through a specific exhaust port, and while keeping the flowing process gases in the process chamber under controlled pressure conditions during said process operations.

It is also a purpose of the invention to provide a process chamber for processing wafers using flowing process reactive gases at high temperatures and low gas pressure values, said process chamber having a first and a second separable elements, at least one inlet for the process reactive gases and having such seal means to allow said first and second separable elements to be strictly movable the one with respect to the other, for instance for opening and closing the process chamber between the process operations, while preventing the flowing process reactive gases from exiting the process chamber but through a specific exhaust port during the process operations.

It is a purpose of the invention to provide a reactor having such a process chamber with such seal means, said process chamber having first and second parts of dimension appropriate to receive several wafers at the same time.

BRIEF DESCRIPTION OF THE DRAWINGS

The object of the invention is described in detail hereafter in reference to the following diagrammatic figures among which:

FIGS. 3A and 3B are perspective views of gas-collecting crowns for the process chamber;

FIGS. 4A, 4B and 4C are cross-sectional views of the interface between opposite closing surfaces of movable elements of the process chamber;

DESCRIPTION OF THE PREFERRED EMBODIMENTS

The invention relates to seal means for movably sealing two substantially flat closing surfaces, respectively of two movable elements, said elements forming, when sealed, a boundary between a first space and a second space, in order to prevent a first gas at a first pressure, which is flowing in the first space, to exit through an interface that is still present between said two closing surfaces disposed one opposite to the other for sealing.

The invention particularly relates to seal means for high temperature movable elements of a chamber, said seal means being appropriate to prevent the exit of process reactive gases flowing in said chamber, while the difference of gas pressure between the inside and the outside of the chamber is small, that is to say that the gas pressure inside the chamber is substantially near the atmospheric pressure of the space outside the chamber. The invention is favorably applied to a chemical vapor deposition chamber referred to as process chamber accommodating for example several semiconductor wafers and having movable elements provided with such seal means. The invention also relates to a chemical vapor deposition apparatus referred to as reactor having a process chamber with such seal means. By high temperatures, it is to be understood temperatures of the order of, or higher than, 300° C. The invention finds an application in the industry of chemical vapor deposition apparatus, for example for manufacturing gallium arsenide semiconductor devices.

Accommodating several wafers for manufacturing gallium arsenide semiconductor devices requires a reactor of great dimension such as described in U.S. Pat. No. 4,976,217 whose features are included by reference. The invention however relates to improved seal means for movably closing the deposition chamber. This seal means may be applied to an element referred to as gas-collecting crown in the cited reference. Some favorable examples of realization of a process chamber having such a gas-collecting crown showing an improved modified structure are described hereafter.

Figure 1A:
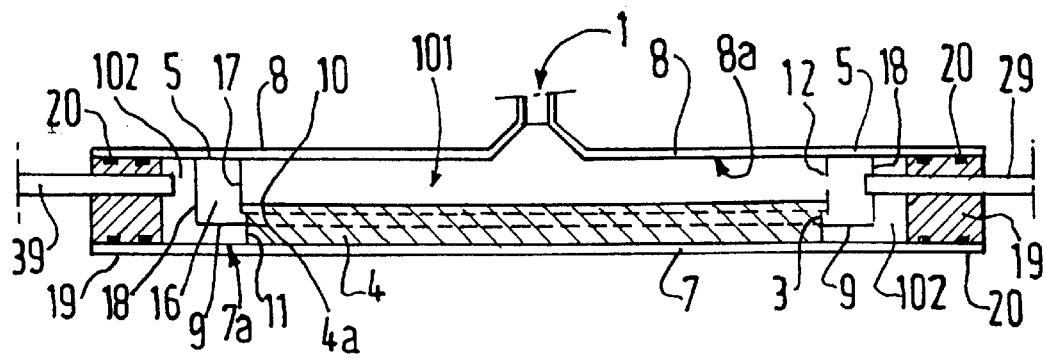
FIG. 1A is a cross-sectional view of a roughly cylindrical process reactor and FIG. 1B is a plan view of the reactor shown in FIG. 1A, whose cover is removed.
Figure 1B:
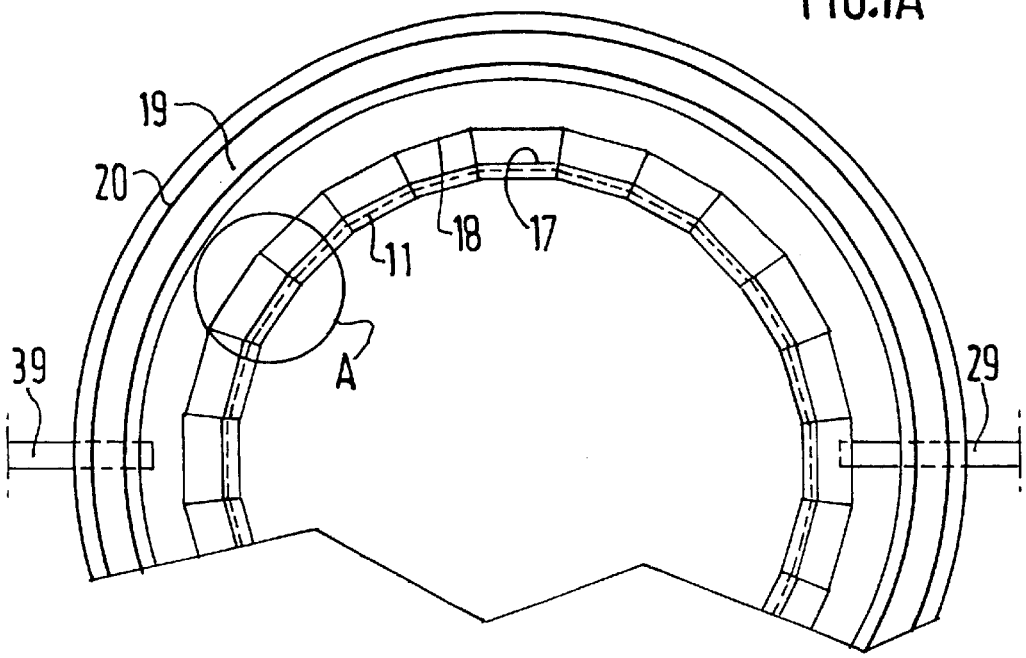

The reactor schematically represented in FIGS. 1A and 1B is roughly cylindrical having a vertical axis. The reactor is provided with a circular fixed platform 4, for example having a diameter of about 25 cm, which in turn supports a system of rotating disks not shown, on which one or several semiconductor wafers are placed. The U.S. Pat. No. 4,961,399 describes such a system for rotating the wafers, as a matter of example.

This platform 4 is arranged within a space, in which reactive gases are in contact with the wafers. The space is constituted by a cylindrical body 19 having a vertical axis, which surrounds the platform 4. On the lower and upper sections of said cylindrical body 19 are placed a bottom constituted by a base plate 7 and a top constituted by a roughly flat cover 8, respectively. The cylindrical body 19 being in a cold area of the reactor, the tightness between said cylindrical body, the plate 7 and the cover 8 is ensured by toric joints 20. The cover 8 can be lifted to place the platform 4. It is practically parallel to the platform in the position shown during the operation, in which reactive gases are introduced into the space through the inlet 1 and move radially above the platform 4 towards the periphery of said platform. The reactive process gases are collected by a gas-collecting crown 16 provided with outlets 12 regularly distributed along the periphery of said platform 4 for collecting the process gases, and with a gas plenum 29 forming an exhaust port for the processing gases. Two tubes 29 arranged diametrically opposite each other merge into the interior of the gas-collecting crown 16 to discharge the gases to the exterior.

The gas-collecting crown 16 surrounds the platform 4 for separating a first space referred to as processing chamber 101, containing the process gases, from a second space 102 disposed between the gas-collecting crown 16 and the peripheral wall 19. Such a gas-collecting crown 16 for the processing chamber 102 comprises a top part 5 having an upper surface 5a, and a low part 9 having a lower surface 9a, said top and low parts being connected by lateral flanges 17 and 18. The processing chamber 101 is limited by the flange 17 of the gas-collecting crown 16.

Figure 2:
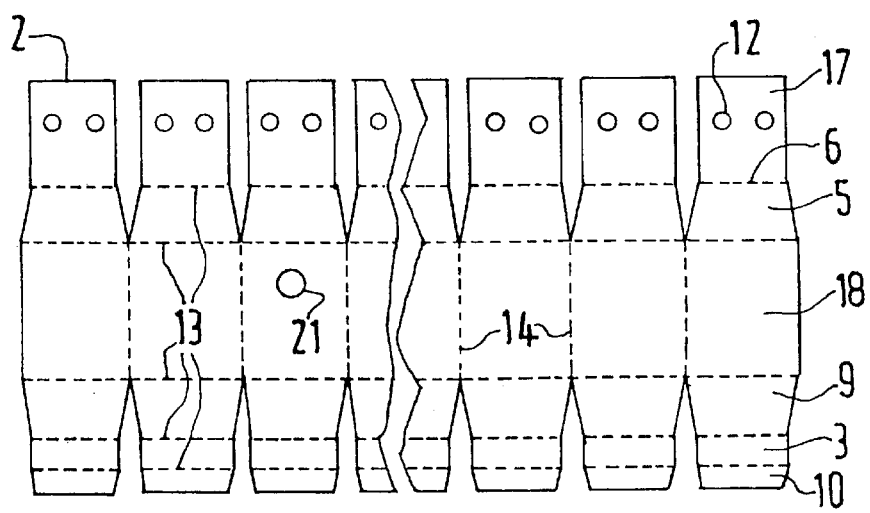
FIG. 2 is a plate from which a gas-collecting crown is formed by folding.

As an example of realization of a gas-collecting crown 16, a part A of said crown is shown in detail in FIG. 2. It consists of an elastic plate of metal folded so that a closed envelope is formed. From one of the edges 2 of the plate, flat plate parts are designated successively by reference numerals 17, 5, 18, 9, 3, 10 connected each time to each other along a horizontal folding line 13. Due to vertical folding lines 14, the closed envelope is divided into successive parts, which enclose an angle with each other, the whole thus constituting a polygon surrounding the platform. For example, in FIG. 1B, the partly shown polygon is a polygon having 24 sides. The essential parts of this crown are the bottom part 9, the top part 5 and the vertical baffle plates 18 and 17, the lower edge 2 of the high part of the vertical baffle plate 17 being fixed to the upper edge 3 of the low part of said vertical baffle plate 17.

In an example illustrated by FIG. 3B, an horizontal projecting part 10, connected to the edge 3, serves to place the crown 16 on the edge of the platform 4. In an other example illustrated by FIG. 3A, the horizontal projecting part 10 does not exits. In that case, the gas-collecting crown 16 is disposed between the base plate 7 and the cover 8.

Referring to FIGS. 3A, 4A, 4B, the upper surface 5a of the crown is positioned in tight contact with the lower surface 8a of the cover 8 thus forming first contact surfaces 5a,8a. Also, the lower surface 9a of the gas-collecting crown is positioned in tight contact with the upper surface 7a of the base plate 7, thus forming second contact surfaces 9a,7a.

Referring to FIGS. 3B, 4A, 4C, the upper surface 5a of the crown is positioned in tight contact with the lower surface 8a of the cover 8 thus forming first contact surfaces 5a,8a. Also, the lower surface 10a of the projecting part 10 of the gas-collecting crown is positioned in tight contact with the upper surface 4a of the platform 4, thus forming second contact surfaces 9a,4a. The gas-collecting crown is made of a material that permits of providing such tight contacts in such a manner that substantially small and regular respective interfaces dented I are present between the first and second contact surfaces, respectively 5a,8a and 9a,7a or 10a,4a. The metal for forming the gas-collecting crown may be favorably molybdenum. This gas-collecting crown made of molybdenum presents the advantages of not involving the risk of exerting excessive forces onto the cover, platform or base plate, of supporting the temperature prevailing in the chamber at the level of the semiconductor wafers and of being resistant to the processing gases use. However tight the contact may be between said respective first and second contact surfaces, respectively 5a,8a and 9a,7a or 10a,4a, said small interfaces I are unavoidable as explained previously. Thus, small amounts of very dangerous and polluting processing gases may exit through those small interfaces.

The present invention provides sealing means in order to avoid the processing gases from exiting through said interfaces, and in order to force said processing gases through the outlets 12 and then through the exhaust port 29. These sealing means do not allow those processing gases to enter the space 102 disposed around the gas-collecting crown 16, between said gas-collecting crown 16 and the cylindrical body 19 of the reactor. A disadvantage of the processing gases exiting through the small interfaces is that they pollute and make deposits in said space 102 external to the chamber 101, so that said space 102 is difficult to clean. Besides, residual dangerous process gases may still be present in the space 102 at the aperture of the process chamber after the deposition process is completed.

Figure 5:
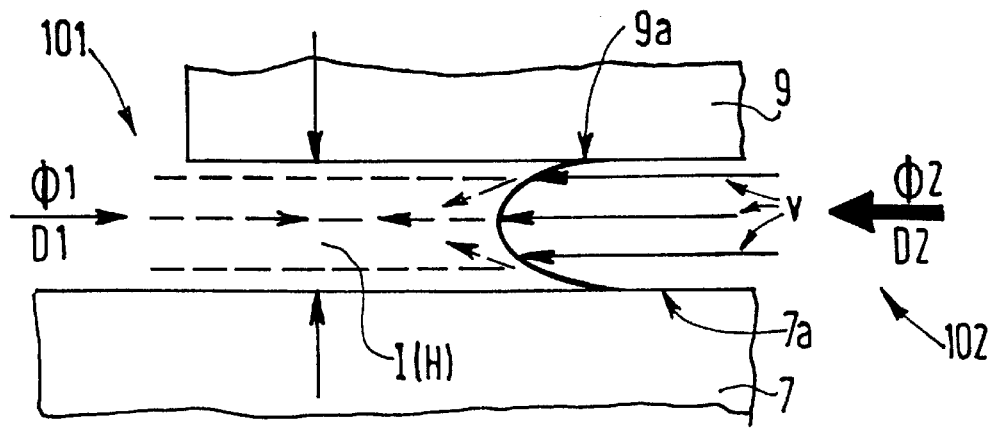
FIG. 5 is an enlarged view of a portion of the interface of FIG. 4A showing the respective paths of the process reactive gases and counter-flow gas through said interface provided by seal means constituted of a trough formed in one surface of said interface.

Referring to FIG. 5, which is an enlarged representation of an interface I such as shown in FIGS. 4A, 4B, 4C, the processing gases, located in a first space 101 such as the process chamber, form a gas flow $\Phi 1$ that has a pressure P1 slightly above the external atmospheric pressure, which results in that said gas flow $\Phi 1$ propagates in a first direction D1 and tends to exit from the process chamber 101 through said interface I.

The sealing means according to the invention first comprises the application of a counter-flow denoted $\Phi 2$ of inert gas that is introduced for instance by an inlet 39 into a second space such as the peripheral space 102, around the gas-collecting crown 16, that has a pressure P2 slightly above the pressure P1, which results in that said gas flow $\Phi 2$ propagates in a second opposite direction D2 and tends to enter the process chamber 101 through said interface I. The counter-flow $\Phi 2$ of inert gas propagates through the interface I as a laminar flow with a parabolic speed profile. According to the parabolic flow propagation, the laminar flow speed V2 is maximum in the middle of the small height, denoted H, of the interface I, while the laminar flow speed is near zero along the so-called contact surfaces, respectively 9a,7a in FIG. 5. In that way, the first flow $\Phi 1$ that has an inferior pressure P1, is not allowed to exit the processing chamber 101 through the interface I. It is known of those skilled in the art that the propagation of laminar gas flow is related to the height H of the interface I, and to the difference of pressure ΔP between the flow and the counter-flow, so as:

$$P2-P1=\Delta P=\Phi 2/H^3 \quad (1)$$

and also that the speed V2 of the flow Φ2 is given by the relation:

$$V2=\alpha.\Phi 2/H \quad (2)$$

where α is a factor of proportionality. It results that the speed V2 of flow (Φ2 is:

$$V2=\alpha.\Delta P.H^2 \quad (3)$$

Thus, a necessary speed V2 to make the counter-flow efficient implies that ΔP or $H^2$ is not too small. It has been previously explained that ΔP is not allowed to be great in order not to disturb the deposition process. Now, it is also important that $H^2$ be not too large in order not to use a great amount of inert gas, which may also disturb the deposition process. As a matter of fact, it is also to be taken into account that the peripheral length of the processing chamber is inevitably important for accommodating several wafers, so that the amount of inert gas entering through the interface I may happen to be too great.

Figure 6A:
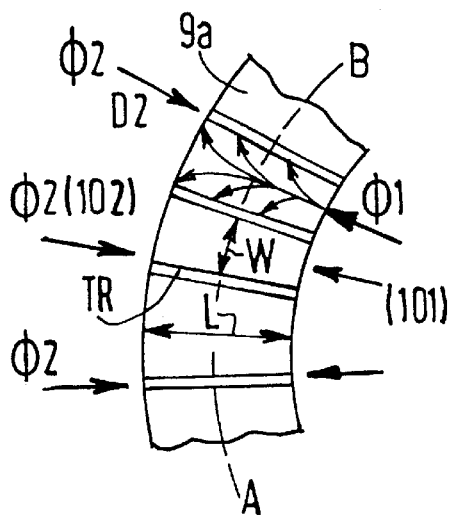
FIG. 6A is a flat view of the interface provided with such seal means applied to at least one of the closing surfaces of the movable elements, and showing the respective paths of the process reactive gases and counter-flow gas through said interface in a situation where the troughs are inconveniently separated.
Figure 6B:
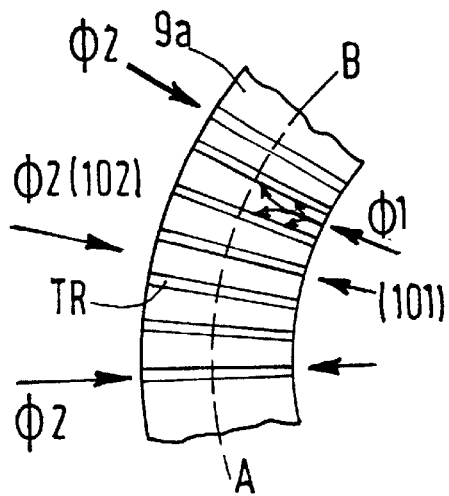
FIG. 6B is a flat view of the interface provided with such seal means applied to at least one of the closing surfaces of the movable elements, and showing the respective paths of the process reactive gases and counter-flow gas through said interface in a situation where the troughs are conveniently separated.
Figure 6C:
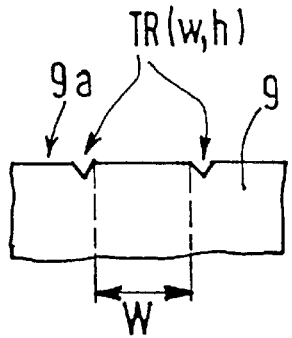
FIG. 6C is a cross-sectional view of the troughs constituting the seal means, along the A-B axis of FIG. 6A, which are formed in one of the closing surfaces.

Referring to FIGS. 6A, 6B, 6C, in order to provide a solution to all those problems, the seal means according to the invention also comprises the formation, in at least one of the two opposite contact surfaces, of a set of substantially radial grooves or troughs TR, performed along a length L at least equal to the radial dimension of the gas-collecting crown horizontal surfaces, for the counter-flow Φ2 to enter the chamber 101 through said grooves or troughs. The set of grooves or troughs is formed preferably in the metallic horizontal surfaces, such as the upper surface 5a or the lower surface 9a or the projecting surface 10a of the gas-collecting crown 16, which forms a gas-collecting means. Now, the depth h and the width w of the groove TR, and the width or spacing W between two adjacent grooves or troughs, are to be determined in order to reach the aims of the invention. To that end, simulations are performed by calculation means of a standard kind according to known standard methods of calculation, which permit determining the proper values of h, w and W, that are to be associated to L and to the peripheral length of the chamber, in combination with the small value H, to permit using a pressure difference ΔP and a counter-flow Φ2 sufficiently small for not disturbing the deposition process.

FIG. 6A is a plan view of a contact surface, for instance 5a, 9a, or 10a, where troughs TR have been performed. The counter-flow Φ2 propagates substantially through the troughs in the direction D2, i. e. from the space 102 towards the inside of the processing chamber 101. The gas flow Φ1, which cannot propagate through the troughs due to the value of the counter-flow Φ2, may however propagate between the troughs, through the still existing interface I of width W and length L. If the width W between troughs is too important, said flow Φ1 may propagate through the whole length L of the interface I from the chamber 101 until it reaches the space 102, which is inconvenient.

Referring to FIG. 6B, showing a disposition of the troughs not so apart, i;e. a disposition with a width W not so large as in FIG. 6A, the gas flow Φ1 is no more allowed to exit the chamber 101 through the interface I, because, due to the appropriate ratio of W and L, said gas flow Φ1 cannot get throughout the whole length L. Of course, said flow Φ1 can neither exit through the troughs.

Figure 7:
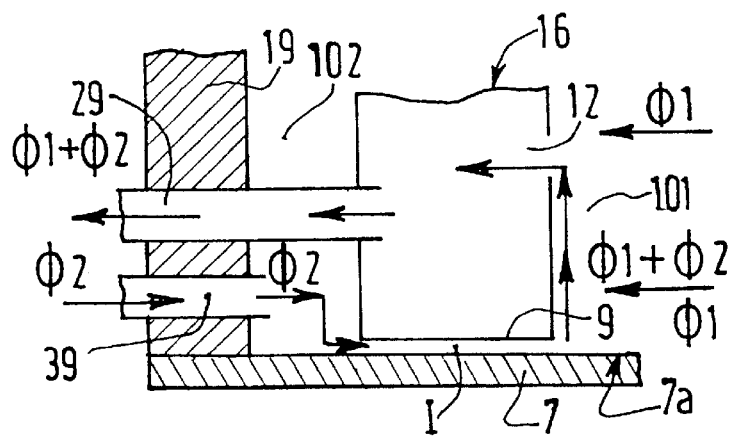
FIG. 7 is a cross-sectional view showing the respective paths of the reactive gases flow and counter-flow applied to the collecting crown, which is disposed around the process chamber, and whose closing surfaces are provided with said seal means.

Referring to FIG. 7, which represents a cross-sectional view of a portion of the gas-collecting crown 16, the counter-flow Φ2 is introduced by the inlet 39. It is shown that both flows Φ1 and Φ2 are collected by the outlets 12, and then by the exhaust port 29. So, the counter-flow Φ2 does not disturb the process. Moreover, the gas flow Φ1 also exits through the gas-collecting crown 16, being not allowed to get through the interface I.

Thus, referring again to FIG. 5, for movably sealing two substantially flat contact surfaces such as 7a, 9arespectively of two movable elements such as 7, 9, located in a high temperature area, said elements separating, when sealed, a first space 101 from a second space 102 in order to prevent a first gas flow Φ1 at a first pressure P1 in the first space 101 to get through an unavoidable interface I that remains present between said two contact surfaces when disposed one opposite to the other, high temperature seal means are formed according to the general principle of:

constructing said two contact surfaces 7a, 9a of the two movable elements 7, 9 appropriate to be positioned opposite one with respect to the other, so forming an interface I having a height H and a contact length L in the direction of the first gas flow Φ1, forming troughs TR regularly provided throughout at least one of said contact surfaces along said length L, in the direction of the first gas flow Φ1, disposed apart from each other of a width W, having a depth h and a width w, whose values L, w, W, h, and H have been calculated as recited above in order to obtain the efficiency of relation (3), disposing the closing surfaces opposite to one another, propagating the first gas flow Φ1 at the first pressure P1 in a first space 101, in the first direction D1, and propagating a second gas flow Φ2 denoted counter-flow at a second pressure P2 in the second space 101, in an opposite direction D2, throughout said interface I provided with such troughs TR, such as P2>P1, and such that relation (3) is verified.

These seal means permits of preventing the first gas flow Φ1 to get through the interface I. The section of FIG. 6 clearly shows that the gas introduced through the inlet 1 cannot pass around the crown. It therefore passes exclusively through the inlets 12 and does not form dirtying deposits, neither on the cover nor on the periphery of the platform.

Preferably, in a reactor having a process chamber 101 and a space 102 surrounding the crown 16, the pressure difference ΔP=P2−P1 is about $10^{-5}$ to $10^3$ mbars, which is considered a small difference of pressure; the height H of the interface I between closing surfaces is about 0 to 1 mm, preferably 0.05 to 0.1 mm, which is considered small; the width w and the depth h of the troughs TR are about w≈1 mm and h≈0.3 mm; and the ratio giving the width W between troughs is such as W≈5 w.

What is claimed is:

1. A chemical vapor deposition chamber for accommodating semiconductor wafers, said chamber comprising a base, a solid wall mounted on said base and a cover forming a first separable element being disposed on the solid wall and extending substantially parallel to the base, a gas-collecting means, which is a conduit for exhausting process gases being located between the base and the cover and forming a second separable element of the chamber, said gas-collecting means sub-dividing the chamber into a first space and a second space disposed adjacent the solid wall, an inlet for introducing a process gas at a first pressure into the first space with a first gas flow, the first and second separable elements provided with closing surfaces coacting to form a pair of closing surfaces, said pair of closing surfaces forming a boundary between the first space and the second space and preventing the first gas flow from flowing through an interface between the pair of closing surfaces, at least one of the closing surfaces being provided with a set of grooves extending across the boundary for interconnecting the first and second space, means for introducing an inert gas into the second space at a second pressure to pass through said grooves into the first space, said grooves having a width and depth and a separation between adjacent grooves which are determined in combination with a height of the interface along with the length of the boundary, with said second pressure of the inert gas for preventing said process gas from exiting through the interface along the grooves and along the length and spacing of the interface between the grooves, so that the grooves have construction parameters so that a small pressure differential between the second space and the first space in combination with a small interface height and the flow of the inert gas will not disturb the deposition process.

2. A chemical vapor deposition chamber according to claim 1, wherein a counter-flow is introduced by an inlet into the second space between the gas-collecting means and the solid wall and both flows of the inert gas and the process gas are collected by outlets of the gas-collecting means to exit through a gas-collecting means in a common exhaust port.

3. A chemical vapor deposition chamber according to claim 2, wherein the gas-collecting means surrounds a platform and forms a gas-collecting crown, the cover being removable to enable semiconductor wafers to be placed in position on the platform.

4. A chemical vapor deposition chamber according to claim 3, wherein the gas-collecting crown having an upper part substantially parallel to the cover during operation, said upper part forming the second separable element of the chamber that is provided with the closing surface, said cover and gas-collecting crown upper part forming the boundary between the first space of the deposition chamber and the second space formed outside of the gas-collecting means.

5. A chemical vapor deposition chamber according to claim 1, wherein the base forms and additional separable element of the chamber provided with a closing surface and the gas-collecting means has a lower part substantially parallel to the base during operation, said lower part forming a closing surface coacting with the closing surface of the base, the closing surface of said base and the lower part of said gas-collecting means forming a boundary between the first space and the second space.

6. A chemical vapor deposition chamber according to claim 1, wherein the base supports a platform for supporting the semiconductor wafers to be processed in the chamber, said platform forming an additional first separable element of the chamber and being provided with a closing surface, the gas-collecting means having a projecting part substantially parallel to the platform, said projecting part forming a separable element of the chamber with a closing surface coacting with the closing surface of the platform to form a seal boundary between the first space of the deposition chamber and the second space.

7. A chemical vapor deposition chamber according to claim 6, wherein the gas-collecting means forms a crown surrounding the platform, said gas-collecting means having an upper surface coacting with a lower surface of the cover to form a first set of contact surfaces, the lower surface of the projecting part of the gas-collecting means being positioned in tight contact with the upper surface of the platform to form a second set of contact surfaces.

8. A chemical vapor deposition chamber according to claim 7, wherein each of said sets of contact surfaces have at least one surface provided with the grooves.

9. A chemical vapor deposition chamber according to claim 1, wherein the gas-collecting means is a crown surrounding a platform disposed on the base of the chamber, said closing surfaces being formed between an upper portion of said crown and said cover, said crown and said base having a second set of closing surfaces, each set of closing surfaces having at least one surface provided with the grooves.

10. A chemical vapor deposition chamber according to claim 1, which includes a platform disposed on the base plate, said gas-collecting means being a crown surrounding the base plate, and said solid wall being a cylindrical wall surrounding said crown, so that the second space is substantially an annular space and said solid wall having an inlet for the inert gas.

11. An epitaxy reactor comprising a base plate, a platform disposed on the base plate, a peripheral body surrounding the platform being disposed on the base plate and a flat cover extending parallel to the base plate spaced by the peripheral body therefrom, an inlet disposed in the cover over a point on the platform, so that a first gas at a first pressure flows radially across the platform from the point toward the periphery of the platform, a gas-collecting means surrounding said platform and separating a first space above the platform from a second space adjacent the peripheral body, said gas-collecting means having gas outlets so that gases can be withdrawn from the first space, the gas-collecting means having at least one contact surface forming a contact surface with one of the base plate, cover and platform to form an interface between a pair of closing surfaces forming a boundary between the first space and the second space, at least one of the closing surfaces of said pair having spaced grooves extending across the boundary in a direction of the flow of the first gas, the second space having means for introducing an inert gas to flow along said grooves and interface toward the first space to be removed through the gas outlets of said gas-collecting means, said grooves having a spacing between adjacent grooves, a height and width of the grooves selected relative to a height of the interface of the boundary surfaces so that a small pressure differential between the first flow and the inert gas in combination with a small interface height will not disturb the deposition process in the reactor.

12. An epitaxy reactor according to claim 11, wherein the gas-collecting means is a gas-collecting crown which surrounds the platform and is provided with outlets regularly distributed along the periphery of the platform, wherein the first flow is introduced in the deposition chamber through an inlet at the center of the chamber and is exited through the outlets of the crown and the second flow is introduced into the second space between the gas-collecting crown and the peripheral body wall and exits through the same outlets of the gas-collecting crown.

13. An epitaxy reactor according to claim 12, wherein the gas-collecting crown is formed from a single plate folded on itself along fold lines to constitute a conduit having a polygonal cross-section having at least one flat surface for constituting one closing surface of each pair of closing surfaces, said conduit having a general shape of a polygon surrounding the platform.

* * * * *